(12) United States Patent
Fujihara et al.

(10) Patent No.: US 11,169,206 B2
(45) Date of Patent: Nov. 9, 2021

(54) INSPECTION APPARATUS, INSPECTION SYSTEM, AND ALIGNING METHOD

(71) Applicant: TOKYO ELECTRON LIMITED, Tokyo (JP)

(72) Inventors: Jun Fujihara, Yamanashi (JP); Masanori Ueda, Yamanashi (JP); Kentaro Konishi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 155 days.

(21) Appl. No.: 16/619,260

(22) PCT Filed: Apr. 16, 2018

(86) PCT No.: PCT/JP2018/015715
§ 371 (c)(1),
(2) Date: Dec. 4, 2019

(87) PCT Pub. No.: WO2018/225384
PCT Pub. Date: Dec. 13, 2018

(65) Prior Publication Data
US 2020/0096560 A1    Mar. 26, 2020

(30) Foreign Application Priority Data

Jun. 5, 2017 (JP) .............................. JP2017-110744

(51) Int. Cl.
*G01R 31/20* (2006.01)
*G01R 31/26* (2020.01)
(Continued)

(52) U.S. Cl.
CPC ..... *G01R 31/2887* (2013.01); *G01R 1/07342* (2013.01); *G01R 31/2893* (2013.01)

(58) Field of Classification Search
CPC ........ G01R 31/02; G01R 31/20; G01R 31/26; G01R 31/28; G01R 31/31; G01R 1/067; G01R 1/073
See application file for complete search history.

(56) References Cited

U.S. PATENT DOCUMENTS

2013/0241588 A1* 9/2013 Yamada ............. G01R 31/2601
324/750.24

FOREIGN PATENT DOCUMENTS

| JP | 2009-204492 A | 9/2009 |
| JP | 2014-75420 A | 4/2014 |
| JP | 2017-69427 A | 4/2017 |

OTHER PUBLICATIONS

PCT International Search Report and Written Opinion, PCT Application No. PCT/JP2018/015715, dated Jun. 5, 2018, 6 pages (with English translation of International Search Report).

* cited by examiner

*Primary Examiner* — Neel D Shah
(74) *Attorney, Agent, or Firm* — Fenwick & West LLP

(57) ABSTRACT

The present disclosure is provided with a probe card and a transfer stage for transferring an inspection target toward the probe card. The transfer stage is provided with a chuck top on which the inspection target is mounted, an aligner configured to be contacted to or separated from the chuck top, and an aligning mechanism for aligning the chuck top with the aligner. The aligning mechanism has radially-expandable positioning pins at a plurality of positions on the upper surface of the aligner, and pin insertion members at positions on the lower surface of the chuck top corresponding to the positioning pins, the pin insertion members having pin insertion holes of which diameters are larger than those of the positioning pins that are not radially expanded. The chuck top is aligned with the aligner by inserting the (Continued)

positioning pins into the pin insertion holes and radially expanding the positioning pins.

12 Claims, 13 Drawing Sheets

(51) Int. Cl.
*G01R 31/28* (2006.01)
*G01R 1/067* (2006.01)
*G01R 1/073* (2006.01)

INSPECTION APPARATUS, INSPECTION SYSTEM, AND ALIGNING METHOD

TECHNICAL FIELD

The present disclosure relates to an inspection apparatus and an inspection system for inspecting electrical characteristics of a target object, and an aligning method.

BACKGROUND

In a process of manufacturing a semiconductor device, electrical characteristics of a plurality of semiconductor devices (hereinafter, simply referred to as "devices") formed on a wafer are inspected after all processes are performed on a semiconductor wafer (hereinafter, simply referred to as "wafer.") An inspection apparatus (prober) for performing such inspection includes a probe card having contact probes that are multiple contact terminals. By bringing the wafer into contact with the probe card, the contact probes are brought into contact with electrode pads or solder bumps of the devices. Then, electricity is allowed to flow from the contact probes to electric circuits of the devices connected to the electrodes to thereby inspect the electrical characteristics such as conduction states of the electric circuits and the like using a tester (see, e.g., Patent Document 1).

Recently, there was suggested a wafer inspection system capable of improving an inspection efficiency. This wafer inspection system includes a plurality of inspection apparatuses, each having a probe card and a tester. In this wafer inspection system, while a wafer is being transferred to one inspection apparatus by a transfer stage including an aligner and a chuck top, devices formed on the wafer can be inspected by another inspection apparatus. In this wafer inspection system, when the wafer is brought into contact with a probe card of each inspection apparatus, the space between the chuck top for attracting and holding the wafer and the probe card is depressurized. Accordingly, the electrodes of the devices formed on the wafer and the contact probes of the probe card can be brought into contact with each other in a state where the chuck top is attracted (see, e.g., Patent Document 2).

In the inspection system disclosed in Patent Document 2, the transfer stage is formed by connecting the chuck top and the aligner (chuck base). The wafer W is mounted, attracted, and held on the chuck top. Then, the chuck top is aligned by the aligner. Next, the chuck top is lifted and attracted by the aligner. Thereafter, the aligner is separated from the chuck top and moved to another inspection apparatus (tester). Then, the aligner is connected to a chuck top on which an inspected wafer is mounted and transfers the inspected wafer.

In this case, when the aligner and the chuck top are connected to each other, it is required to accurately align the chuck top with respect to the aligner in a plane direction, a vertical direction, and a rotation direction.

Therefore, in Patent Document 3, the inspection apparatus in which the aligner and the chuck top can be brought into contact with each other or separated from each other includes an aligning mechanism having a plurality of positioning pins formed on an upper surface of the aligner and a plurality of positioning blocks having V-shaped grooves and formed on a bottom surface of the chuck top to correspond to the positioning pins. The aligner and the chuck top are aligned by engaging the positioning pins with the positioning blocks.

PRIOR ART

Patent Document 1: Japanese Patent Application Publication No. 2009-204492
Patent Document 2: Japanese Patent Application Publication No. 2014-75420
Patent Document 3: Japanese Patent Application Publication No. 2017-69427

The present disclosure provides a technique capable of aligning a chuck top for holding an inspection target to be in contact with contact probes of a probe card and an aligner for aligning the chuck top with high accuracy in the case where the chuck top and the aligner can be brought into contact with each other or separated from each other.

SUMMARY

In accordance with an aspect of the present disclosure, there is provided with an inspection apparatus comprising: a probe card that has multiple contact probes to be in contact with an inspection target and that is connected to a tester to inspect electrical characteristics of the inspection target; and a transfer stage configured to transfer the inspection target toward the probe card, wherein the transfer stage includes: a chuck top configured to mount thereon the inspection target; an aligner that is configured to be brought into contact with the chuck top or separated from the chuck top and configured to move the chuck top; and an aligning mechanism configured to align the chuck top and the aligner, wherein the aligning mechanism has a plurality of radially-expandable positioning pins disposed on one between a bottom surface of the chuck top and an upper surface of the aligner, and a plurality of pin insertion members that are disposed on the other one between the bottom surface of the chuck top and the upper surface of the aligner and that correspond to the positioning pins, each of the pin insertion members having a pin insertion hole of which diameter is greater than a diameter of the positioning pin that is not radially expanded, and the chuck top and the aligner are aligned with each other by moving the aligner toward the chuck top, inserting the positioning pins into the pin insertion holes, and radially expanding the positioning pins.

Effect

The present disclosure provides a technique capable of aligning a chuck top for holding an inspection target to be in contact with contact probes of a probe card and an aligner for aligning the chuck top with high accuracy in the case where the chuck top and the aligner can be brought into contact with each other or separated from each other.

DETAILED DESCRIPTION

Hereinafter, embodiments will be described in detail with reference to the accompanying drawings.

<Inspection System>

First, an overall configuration of an example of an inspection system will be described.

Figure 1:
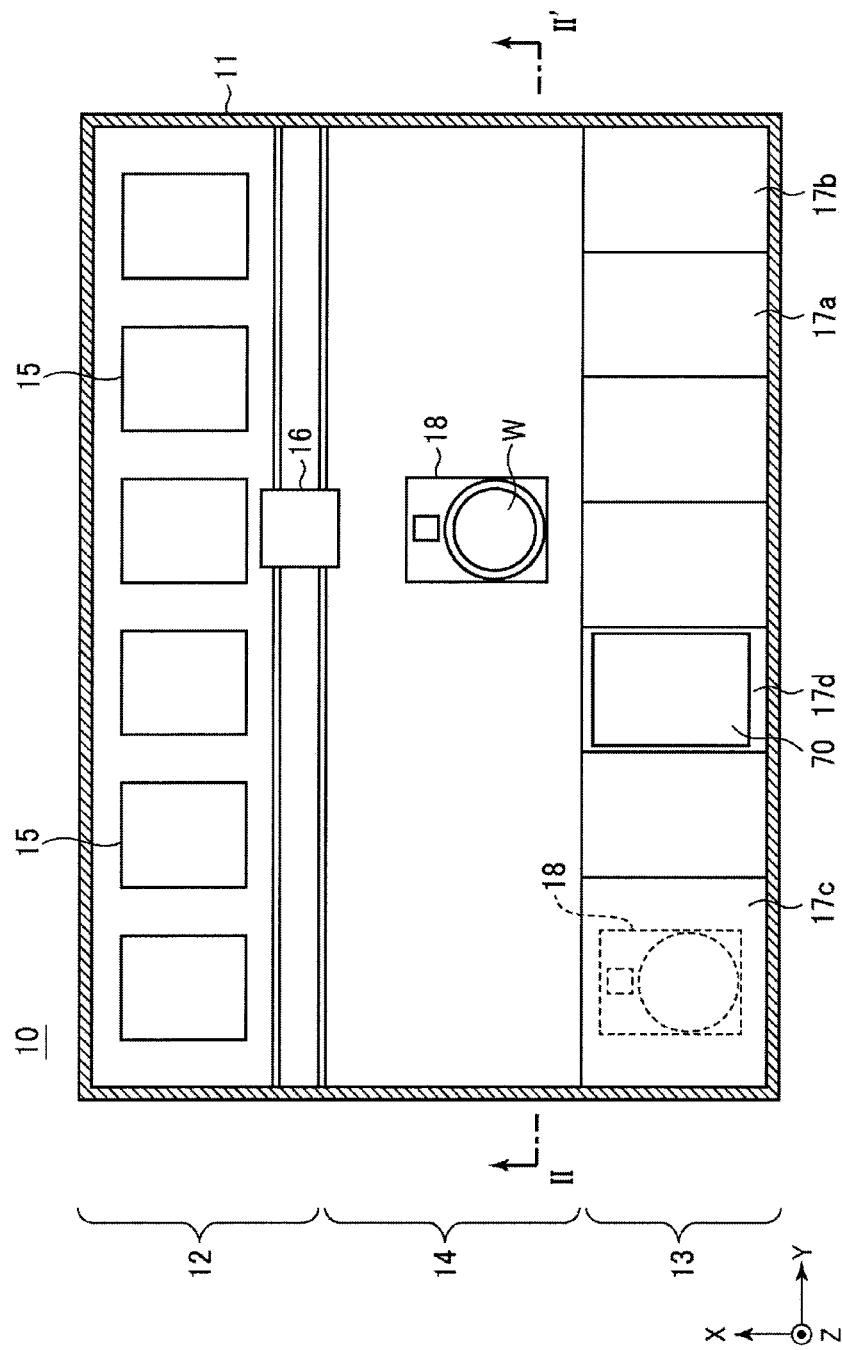
FIG. 1 is a horizontal cross-sectional view schematically showing an exemplary configuration of an inspection system.
Figure 2:
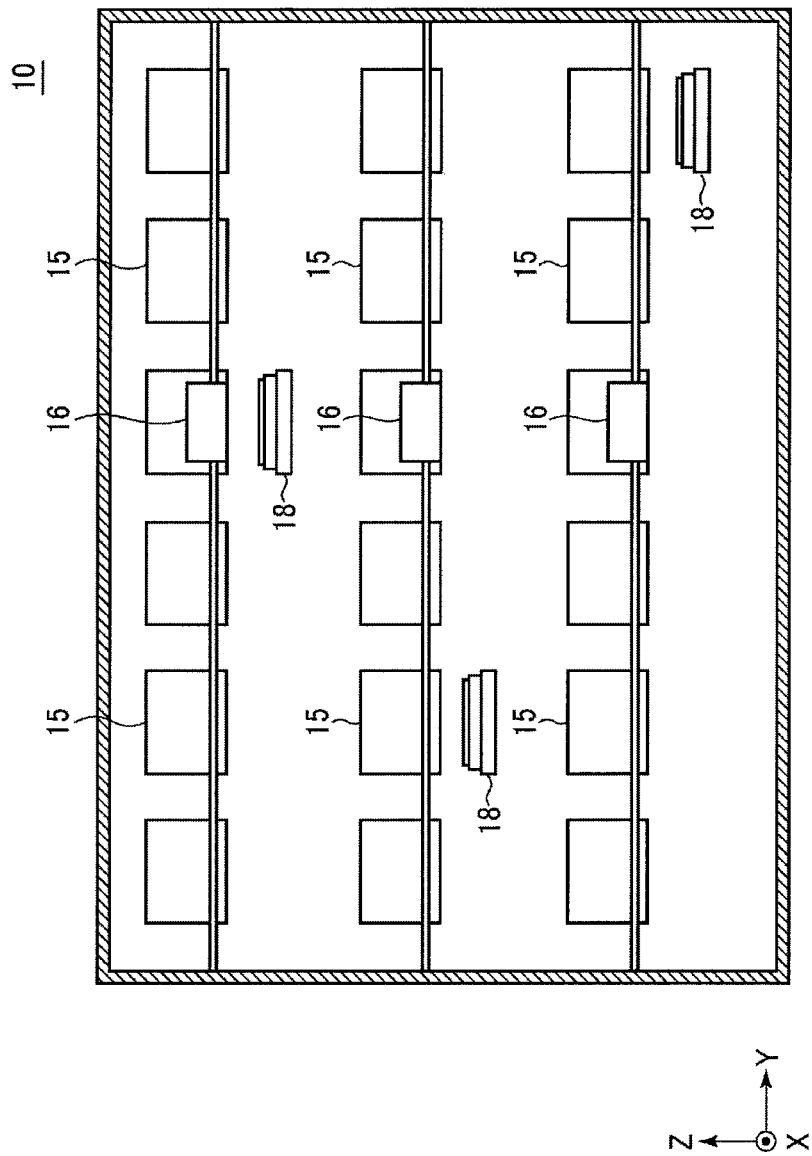
FIG. 2 is a vertical cross-sectional view taken along a line II-II' in FIG. 1.

FIG. 1 is a horizontal cross-sectional view schematically showing the overall configuration of the example of the inspection system. FIG. 2 is a vertical cross-sectional view taken along a line II-II' in FIG. 1.

As shown in FIGS. 1 and 2, the inspection system 10 includes a housing 11. The housing 11 has an inspection area 12 for inspecting electrical characteristics of semiconductor devices of a wafer W, a loading/unloading area for loading/unloading the wafer W or the like with respect to the inspection area 12, and a transfer area 14 disposed between the inspection area 12 and the loading/unloading area 13.

In the inspection area 12, tester rows, in each of which a plurality of (six in this example) testers 15 serving as wafer inspection interfaces are arranged along the Y direction in FIG. 1, are arranged in three stages along the Z direction (vertical direction). Further, one tester side camera 16 (inclination checking mechanism) is arranged for each tester row. Each tester side camera 16 moves horizontally along a tester row corresponding thereto, and is positioned in front of each tester 15 of the tester row to determine a position of a wafer W or the like transferred by a transfer stage 18 to be described later or a degree of inclination of a chuck top 29 to be described later. A probe card 19 is attached to each tester 15 as will be described later. An inspection unit 30 is configured as a mechanism for bringing a wafer W on the chuck top 29 to be described later into contact with contact probes 25 of the probe card 19.

The loading/unloading area 13 is partitioned into multiple ports including a wafer loading/unloading port 17a, an aligner port 17b, a loader port 17c, and a control unit accommodation port 17d. The wafer loading/unloading port 17a accommodates a FOUP that is a container where a plurality of wafers is stored. The aligner port 17b accommodates an aligner for aligning the wafer. The loader port 17c accommodates a loader into and from which the probe card 19 is loaded and unloaded. The control unit accommodation port 17d accommodates a control unit 70 for controlling operations of each of the components of the inspection system 10.

In the transfer area 14, a transfer stage 18 that is movable along the Y direction and also movable toward the inspection area 12 or the loading/unloading area 13 is disposed. One transfer stage 18 is provided to correspond to each tester row. The transfer stage 18 transfers the wafer W from the wafer loading/unloading port 17a in the loading/unloading area 13 to each tester 15, and also transfers the wafer W having the semiconductor devices of which electrical characteristics have been inspected from each tester 15 to the wafer loading/unloading port 17a.

In this wafer inspection system 10, the electrical characteristics of the devices of the wafer W transferred to each inspection unit 30 (tester 15) are inspected. As will be described later, while the transfer stage 18 is transferring the wafer W toward one inspection unit 30, other inspection units 30 can inspect the electrical characteristics of the devices of other wafers W.

The control unit 70 includes a main controller having a CPU (computer) and configured to control the respective components of the inspection system 10, an input device (keyboard, mouse, or the like), an output device (printer or the like), a display device (display, or the like), and a storage device (storage medium). The respective components of the inspection system 10 are the tester 15 of each inspection unit 30, the transfer stage 18, the vacuum mechanism, and the like. The main controller of the control unit 70 causes the inspection system 10 to perform a predetermined operation based on a processing recipe stored in a storage medium built in the storage device or in a storage medium set in the storage device.

<Embodiments of Inspection Unit and Transfer Stage>

Next, embodiments of the inspection unit 30 and the transfer stage 18 will be described.

Figure 3:
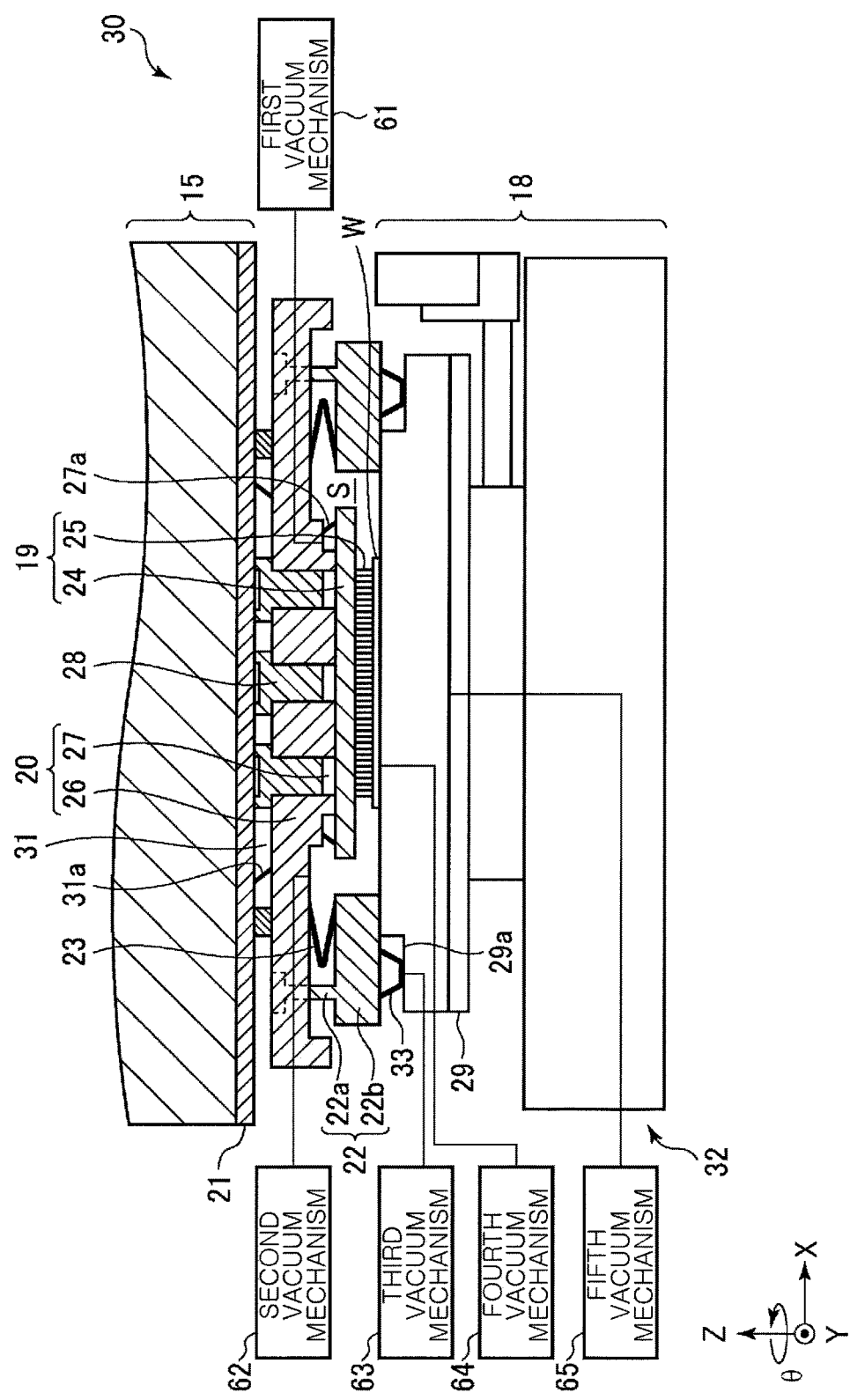
FIG. 3 is a cross-sectional view of configurations of an inspection apparatus and a transfer stage in the inspection system shown in FIG. 1 and mainly explains the inspection apparatus.
Figure 4:
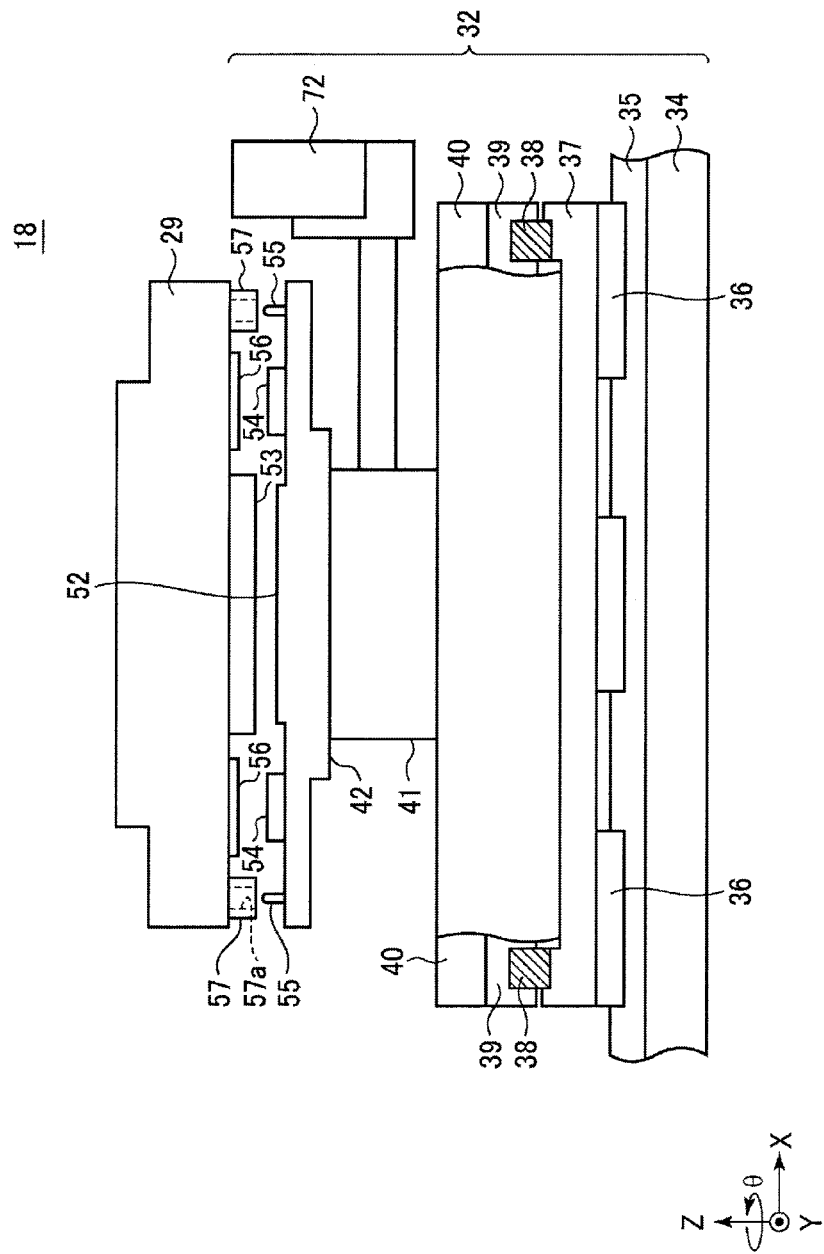
FIG. 4 is a cross-sectional view for explaining the transfer stage in detail.
Figure 5:
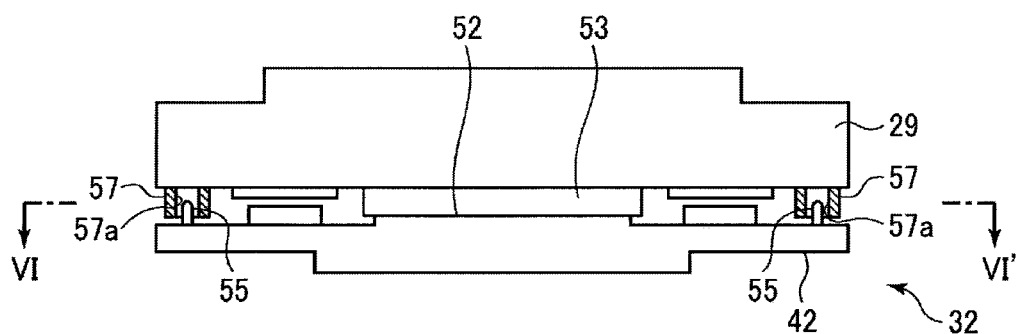
FIG. 5 shows a state in which a chuck top and an aligner of the transfer stage are connected to each other.
Figure 6:
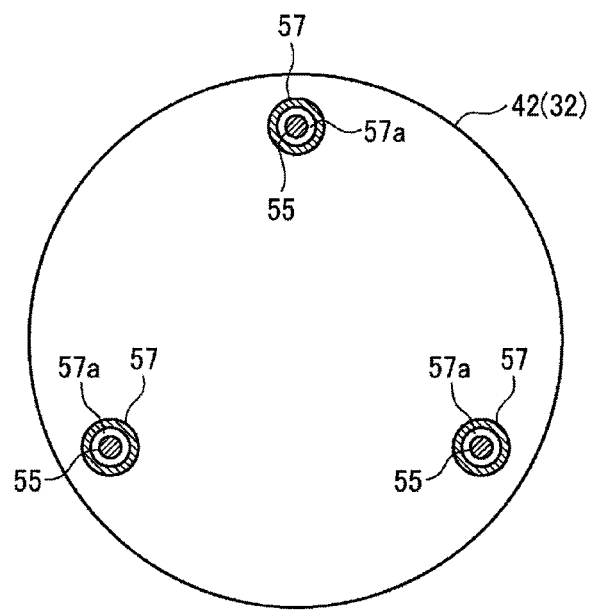
FIG. 6 is a cross-sectional view taken along a line VI-VI' in FIG. 5.

FIG. 3 is a cross-sectional view showing configurations of the inspection unit 30 and the transfer stage 18 and mainly explains the inspection unit 30. FIG. 4 is a cross-sectional view for explaining the transfer stage 18 in detail. FIG. 5 shows a state in which an aligner 32 and the chuck top 29 of the transfer stage are connected to each other. FIG. 6 is a cross-sectional view taken along a line VI-VI' in FIG. 5. In FIGS. 3 and 4, the left-right direction is the X-direction, the depth direction is the Y-direction, the up-down direction is the Z-direction, and the rotation direction about the Z-axis is the θ-direction.

FIG. 3 shows a state in which the transfer stage 18 brings the wafer W into contact with the probe card 19, and mainly shows the configuration of the inspection unit 30 including the tester 15, the probe card 19, and the like.

As shown in FIG. 3, in the inspection unit 30, the tester 15 is integrally assembled, and has a motherboard 21 at a lower side thereof. The tester 15 has multiple inspection circuit boards (not shown) vertically fitted into the motherboard 21.

A pogo frame 20 is disposed below the tester 15 to be fixed to a device frame (not shown). The probe card 19 is attached to the bottom of the pogo frame 20. A cylindrical flange 22 capable of moving in the vertical direction with respect to the pogo frame 20 is engaged with the pogo frame 20. A cylindrical bellows 23 is interposed between the pogo frame 20 and the flange 22.

The probe card 19 includes a disk-shaped main body 24, a plurality of electrodes (not shown) disposed substantially on the entire upper surface of the main body 24, and a plurality of contact probes 25 (contact terminals) disposed to protrude downward from the bottom surface of the main body 24. The electrodes are connected to the contact probes 25 corresponding thereto. Each of the contact probes 25 is brought into contact with an electrode pad or a solder bump of a device formed on the wafer.

The pogo frame 20 includes a substantially flat plate-shaped main body 26, and pogo block insertion holes 27 that are multiple through-holes bored near the central portion of the main body 26. Pogo blocks 28 including a plurality of pogo pins are inserted into the pogo block insertion holes 27. The pogo blocks 28 are connected to an inspection circuit (not shown) of the tester 15. Further, the pogo blocks 28 are brought into contact with multiple electrodes on the upper surface of the main body 24 of the probe card 19 attached to the pogo frame 20, and allows currents to flow toward the contact probes 25 of the probe card 19 connected to the electrodes. In addition, the pogo block 28 allows currents flowing from the electric circuits of the semiconductor devices on the wafer W through the contact probes 25 to flow toward the inspection circuit.

The flange 22 has a cylindrical main body 22a and a contact portion 22b that is an annular member formed below the main body 22a. The flange 22 is disposed to surround the probe card 19. As will be described later, the flange moves downward by its own weight so that the bottom surface of the contact portion 22b is positioned below the tip ends of the contact probes 25 of the probe card 19 until the chuck top 29 is brought into contact with the flange 22. The bellows 23 is made of a metal and can be extended and contracted in the vertical direction. A lower end and an upper end of the bellows 23 are in close contact with the upper surface of the contact portion 22b of the flange 22 and the bottom surface of the pogo frame 20, respectively.

A space 31 between the pogo frame 20 and the motherboard 21 is sealed with a sealing member 31a. By evacuating the space 31, the pogo frame 20 is attached to the motherboard 21. A space between the pogo frame 20 and the probe card 19 is also sealed with a sealing member 27a. By evacuating the space, the probe card 19 is attached to the pogo frame 20. The evacuation is performed by a first vacuum mechanism 61.

The transfer stage 18 includes the chuck top 29 that is a thick plate, and the aligner 32. The wafer W is mounted on the upper surface of the chuck top 29. The wafer W is vacuum-attracted to the chuck top 29 by a fourth vacuum mechanism 64. In the case of transferring the wafer W, the chuck top 29 is connected to the aligner 32 and the chuck top 29 is vacuum-attracted to the aligner 32 by a fifth vacuum mechanism 65. Accordingly, when the transfer stage 18 moves, it is possible to prevent the relative movement of the wafer W with respect to the transfer stage 18. A stepped portion 29a is formed at a peripheral portion of the upper surface of the chuck top 29. A sealing member 33 is disposed at the stepped portion 29a.

The chuck top 29 and the aligner 32 can be brought into contact with each other or separated from each other. When the chuck top 29 and the aligner 32 are separated from each other, the evacuation obtained by the fifth vacuum mechanism 65 is released. Each inspection unit 30 includes the chuck top 29. As will be described later, when the inspection unit 30 performs inspection, the chuck top 29 is separated from the aligner 32. When the wafer W is transferred, any one chuck top 29 is connected to the aligner 32 and comprised in the transfer stage 18.

It is not necessary to perform vacuum attraction to hold the chuck top 29 or the wafer W. The chuck top 29 or the wafer W can be held in a different manner as long as the relative movement of the chuck top 29 and the wafer W with respect to the aligner 32 can be prevented. For example, the chuck top 29 or the wafer W can be held by electromagnetic attraction or clamping.

Since the transfer stage 18 is movable, the transfer stage 18 can be moved to a position below the probe card 19 of the inspection unit 30. Thus, the wafer W mounted on the chuck top 29 can face the probe card 19 and can be moved toward the inspection unit 30. When the chuck top 29 is brought into contact with the contact portion 22b of the flange 22 and the wafer W is brought into contact with the probe card 19, a space S is defined by the chuck top 29, the flange 22, the pogo frame 20, and the probe card 19. The space S is sealed by the bellows 23 and the sealing member 33 and is evacuated by the second vacuum mechanism 62. Further, the inside of the sealing member 33 is evacuated by a third vacuum mechanism 63. Accordingly, the chuck top 29 is held by the probe card 19, and the wafer W mounted on the chuck top 29 is brought into contact with the probe card 19. At this time, the electrode pads or the solder bumps of the devices on the wafer W are brought into contact with the contact probes 25 of the probe card 19. In the wafer inspection system 10, the movement of the transfer stage 18 is controlled by the control unit 70, and the control unit 70 controls the position or the amount of movement of the transfer stage 18.

FIG. 4 shows the transfer stage 18 in a state where the chuck top 29 is separated from the aligner 32. As shown in FIG. 4, the aligner 32 includes an X base 34, an X guide 35, a plurality of X blocks 36, a Y base 37, a Y guide 38, a plurality of Y blocks 39, a Z base 40, a Z block 41, and a chuck base 42. The X base 34 is a plate-shaped member, and the X guide 35 has a rail shape extending on the X base 34 in the X direction. The X blocks 36 can move in the X direction while being engaged with the X guide 35. The Y base 37 is a plate-shaped member and is supported by the X blocks 36. The Y guide 38 has a rail shape extending on the Y base 37 in the Y direction. The Y blocks 39 can move in the Y direction while being engaged with the Y guide 38. The Z base 40 is a plate-shaped member and is supported by the Y blocks 39. The Z block 41 moves in the vertical direction while penetrating through the Z base 40. The chuck base 42 is disposed on the Z block 41.

As the X blocks 36 move in the X direction, the Y base 37 can move in the X direction with respect to the X base 34. As the Y blocks 39 move in the Y direction, the Z base 40 can move in the Y direction with respect to the Y base 37 and the X base 34. The Z block 41 can vertically move the chuck base 42 using a plurality of elevating mechanisms (not shown) such as a ball screw mechanism or the like. The chuck base 42 can be rotated in the θ direction by a rotation mechanism (not shown).

The chuck base 42 has a chuck top attracting surface 52 at the center of the upper surface thereof. The chuck top 29 has a bottom plate 53 at the bottom thereof. The chuck top 29 is vacuum-attracted in a state where the bottom surface of the bottom plate 53 and the chuck top attraction surface 52 of the chuck base 42 are in contact with each other. Accordingly, the chuck top 29 is mounted on and attached to the aligner 32.

A plurality of height sensors 54 are arranged at a peripheral portion of the upper surface of the chuck base 42. A plurality of detection plates 56 are arranged at a peripheral portion of the bottom surface of the chuck top 29 to correspond to the height sensors 54.

Multiple (three in this example (see FIG. 6)) radially expandable positioning pins 55 are disposed at the outer side of the height sensors 54 on the upper surface of the chuck base 42. Multiple (three) pin insertion members 57 are disposed at the outer side of the detection plates 56 on the bottom surface of the chuck top 29 to correspond to the positioning pins 55. The positioning pins 55 and the pin insertion members 57 are arranged at equal intervals on the circumferences about the centers of the chuck base 42 and the chuck top 29, respectively. The positioning pins 55 and the pin insertion members 57 constitute an aligning mechanism. A cylindrical insertion hole 57a is vertically formed at the pin insertion member 57. The insertion hole 57a has a diameter greater than a diameter of the positioning pin 55 that is not radially expanded. In other words, the pin insertion member 57 has an inner wall that is a vertical circumferential surface. When the aligner 32 is connected to the chuck top 29, the chuck top 29 and the aligner 32 are aligned by the positioning pins 55 and the pin insertion members 57.

At this time, if the chuck base 42 is raised, the positioning pins 55 that are not radially expanded are inserted into the insertion holes 57a of the pin insertion members 57. If the chuck base 42 is raised further, the state shown in FIG. 5 is obtained. In other words, the bottom plate 53 and the chuck top attraction surface 52 are brought into contact with each other, so that the chuck top 29 and the aligner 32 are aligned in the vertical direction.

Figure 7A:
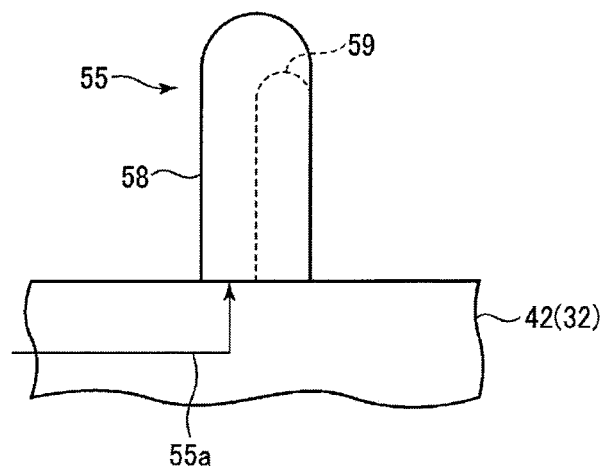
FIG. 7A shows a state before an example of a radially expandable positioning pin used for connection between the chuck top and the aligner is expanded.
Figure 7B:
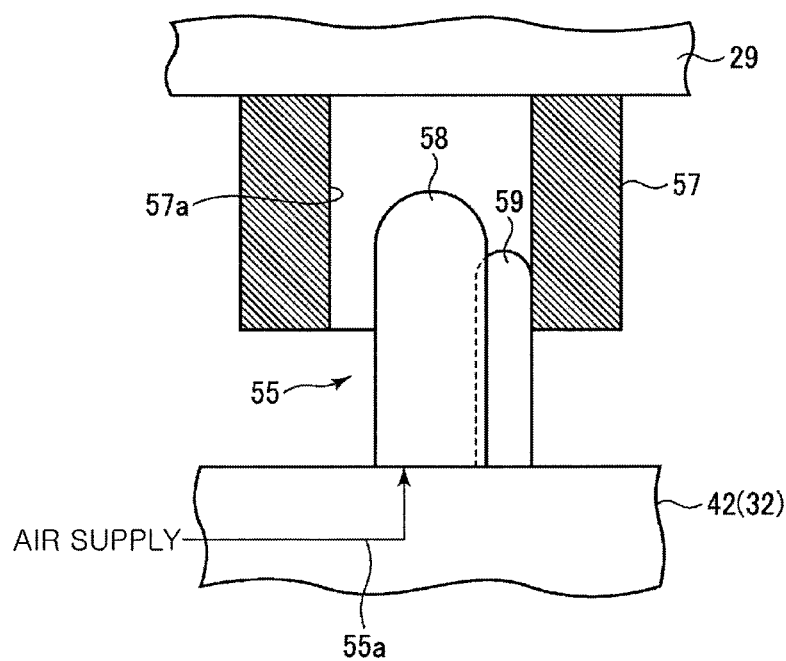
FIG. 7B shows a state after the example of the radially expandable positioning pin used for connection between the chuck top and the aligner is expanded.
Figure 8:
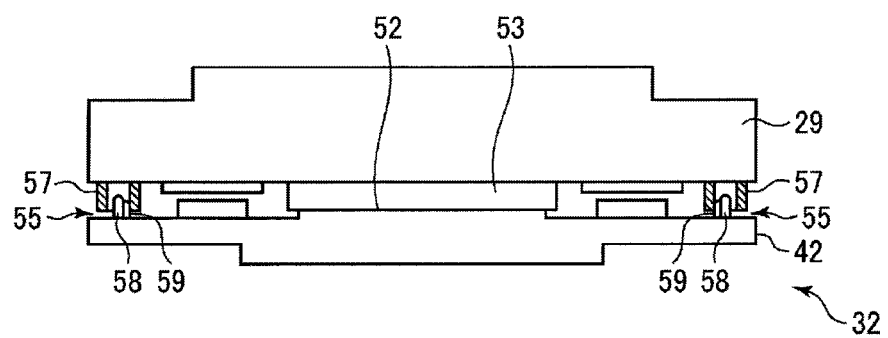
FIG. 8 is a cross-sectional view showing a state in which the positioning pin is radially expanded after the chuck top and the aligner of the transfer stage are connected to each other.

FIG. 7A shows an example of the positioning pin. As shown in FIG. 7A, the positioning pin 55 has a hollow main body 58 and a radially expandable portion 59 accommodated in the main body 58. In this state, if air is supplied into the main body 58 through an air line (air supply mechanism) 55a, the radially expandable portion 59 projects outward from a notched portion (not shown) formed at the main body 58 as shown in FIG. 7B so that the positioning pin 55 can be expanded radially. When the air supply is stopped, the radially expandable portion 59 is returned to the inside of the main body 58 by an elastic member such as a spring or the like. After the positioning pin 55 that is not radially expanded is inserted into the insertion hole 57a of the pin insertion member 57, the radially expandable portion 59 projects and the positioning pin 55 is radially expanded. Accordingly, the chuck base 42 and the chuck top 29 are aligned in the horizontal direction and the rotation direction, as shown in FIG. 8.

As shown in FIG. 4, the aligner 32 has an upper checking camera 72 for checking a degree of inclination of the probe card 19 or the pogo frame 20. The upper checking camera 72 is attached to the Z block 41. The aligner 32 has a plurality of elevating mechanisms for raising and lowering the chuck base 42 as described above. By adjusting the lifting amounts of the elevating mechanisms based on the information of the upper checking camera 72, the degree of inclination of the chuck base 42 can be adjusted.

<Configuration Used for Replacement of Probe Card>

Figure 9:
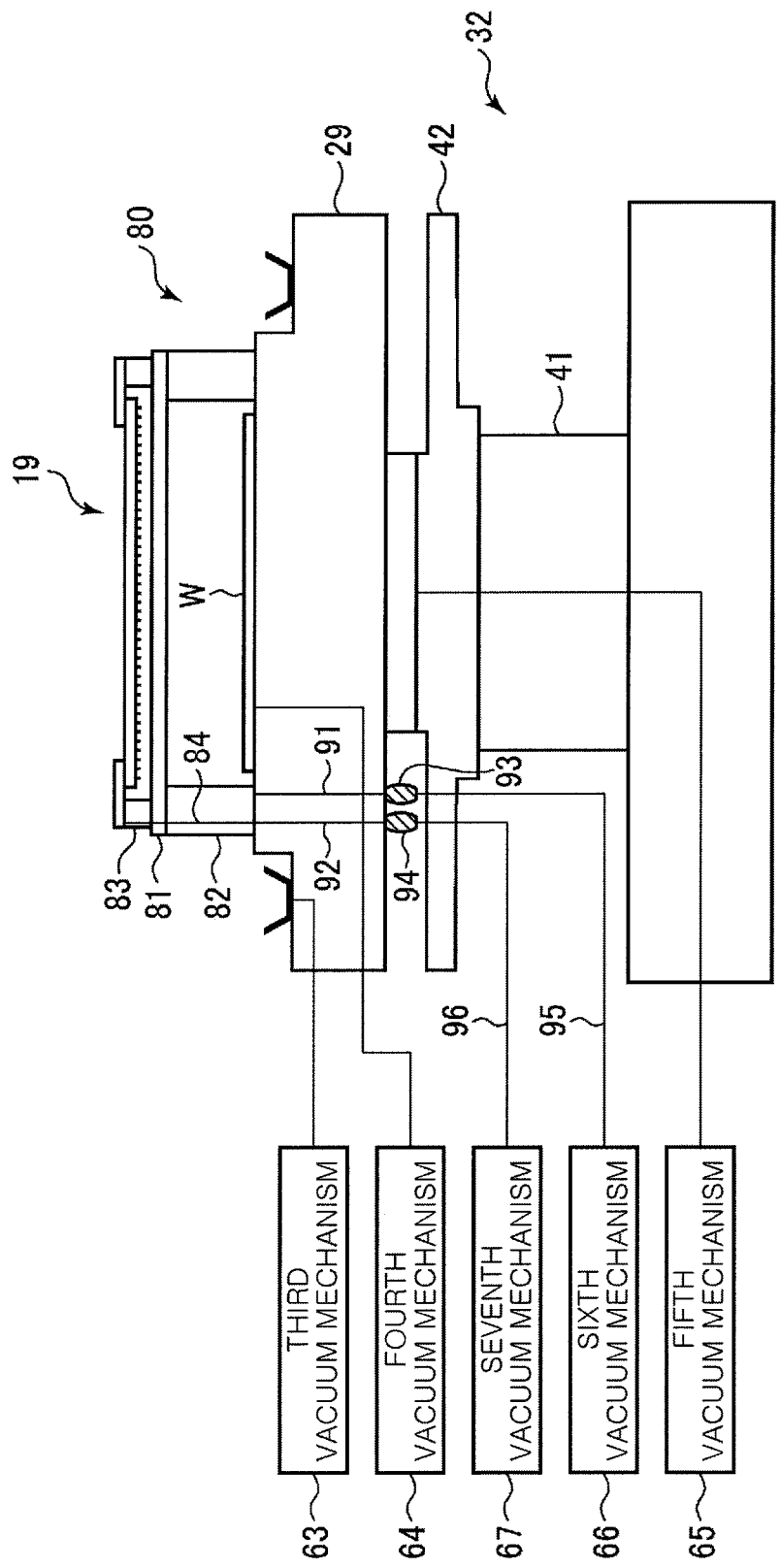
FIG. 9 is a cross-sectional view for explaining a pneumatic circuit used for replacement of a probe card.

In the inspection system 10, when the probe card 19 is replaced, an old probe card 19 is returned to the loader port 17c and a new probe card 19 is mounted by the transfer stage 18. At this time, a mounting jig 80 is used to protect the contact probes 25 of the probe card 19 as shown in FIG. 9. The mounting jig 80 includes a plate 81 having a diameter greater than that of the probe card 19, a cylindrical leg portion 82 attached to the peripheral portion of the bottom surface of the plate 81, and a cylindrical probe card support portion 83 attached to the peripheral portion of the upper surface of the plate 81.

At this time, in order to attach the probe card 19 to the accurate portion of the pogo frame 20, the leg portion 82 is positioned on the chuck top 29 and fixed by vacuum attraction. In addition, the probe card 19 is fixed to the probe card support portion 83 by vacuum attraction. The pneumatic circuit for vacuum attracting the leg portion 82 includes gas exhaust passages 91 and 95, a coupler 93, and a sixth vacuum mechanism 66. The gas exhaust passage 91 is disposed at the chuck top 29. The gas exhaust passage 95 is disposed at the aligner 32. The coupler 93 connects the gas exhaust passage 91 and the gas exhaust passage 95. The sixth vacuum mechanism 66 is connected to the gas exhaust passage 95. A pneumatic circuit for attracting the probe card 19 to the probe card support portion 83 includes gas exhaust passages 84, 92, and 96, a coupler 94, and a seventh vacuum mechanism 67. The gas exhaust passage 84 extends from the probe card support portion 83 to the plate 81 and the bottom surface of the leg portion 82. The gas exhaust passage 92 is formed at the chuck top 29 to be continuous to the gas exhaust passage 84. The gas exhaust passage 96 is disposed at the aligner 32. The coupler 94 connects the gas exhaust passage 92 and the gas exhaust passage 96. The seventh vacuum mechanism 67 is connected to the gas exhaust passage 96.

The couplers 93 and 94 are opened for evacuation when the gas exhaust passages 95 and 96 are connected thereto, respectively, and the couplers 93 and 94 are closed when the gas exhaust passages 95 and 96 are disconnected therefrom, respectively.

Figure 10:
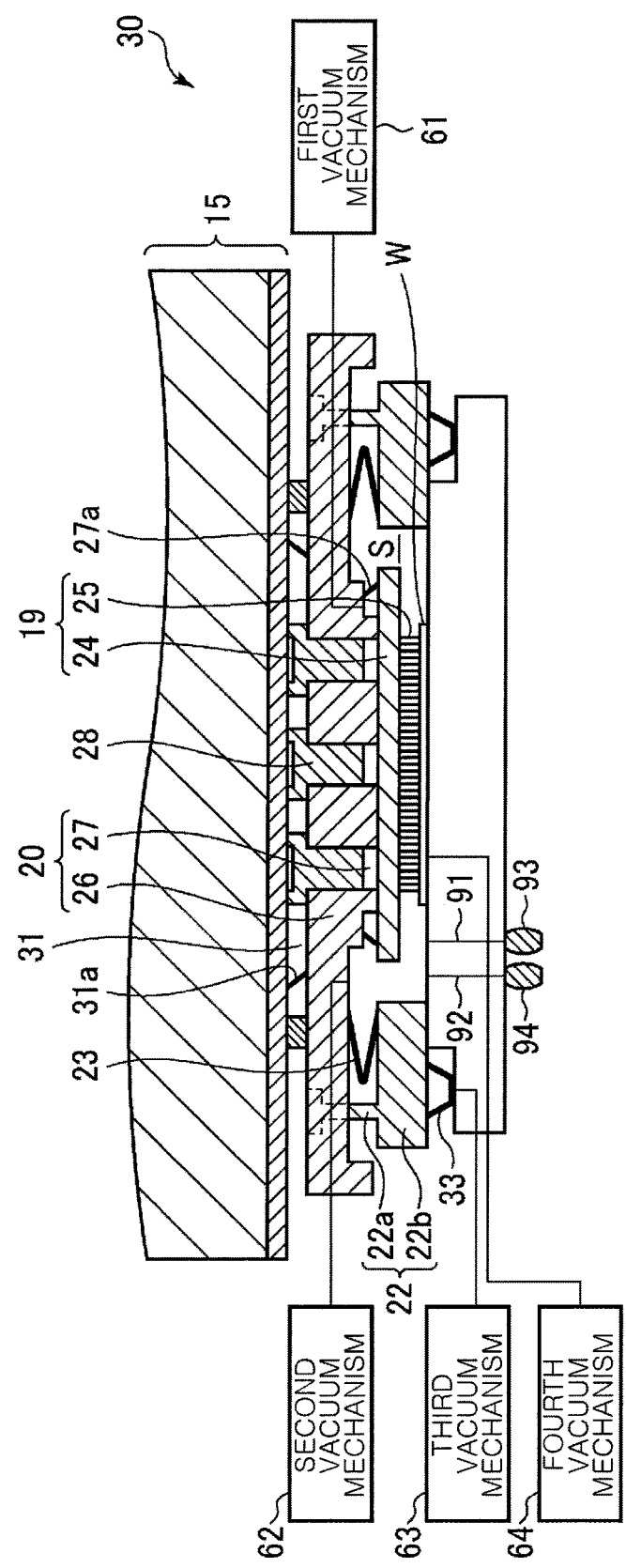
FIG. 10 is a cross-sectional view showing a state in which the pneumatic circuit used for the replacement of the probe card is separated.

In the pneumatic circuits, both of the sixth vacuum mechanism 66 and the seventh vacuum mechanism 67 are disposed at the aligner 32 side. Therefore, as shown in FIG. 10, when the chuck top 29 is attracted to the flange 22 and the aligner 32 is separated from the chuck top 29, the gas exhaust passages 95 and 96 are separated from the couplers and 94, respectively, and the couplers 93 and 94 are closed. Accordingly, the evacuation of the space S is not affected by the second vacuum mechanism 62.

In a conventional case, two pneumatic circuits used for replacing the probe card were disposed on the chuck top side. Therefore, it is required to provide the pneumatic circuits at the chuck tops of which number corresponds to the number of the inspection units 30. On the other hand, in this example, the pneumatic circuits are disposed on the aligner side so that the gas exhaust passages on the chuck top side and the gas exhaust passages on the aligner side can be brought into contact with each other or separated from each other by the couplers. Accordingly, the number of pneumatic circuits in each stage can be reduced. For example, when there are six inspection units 30 in each stage as in this example, 12 pneumatic circuits are required in the conventional case for the six inspection units 30. However, in this example, the number of the pneumatic circuits can be reduced to two.

<Operation of Inspection System>

Next, the operation of the inspection system of the present embodiment will be described.

The wafer W is received from the FOUP of the wafer loading/unloading port 17a by the transfer stage 18, and the transfer stage 18 in which the wafer W is mounted on the chuck top 29 is moved to a position below a predetermined inspection unit 30 (tester 15).

Figure 11A:
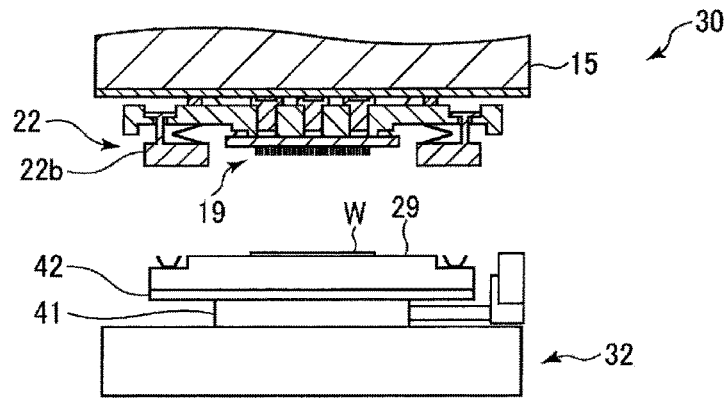
FIG. 11A is a cross-sectional view showing a state in which the transfer stage in which the wafer is mounted on the chuck top is transferred to the inspection apparatus.
Figure 11B:
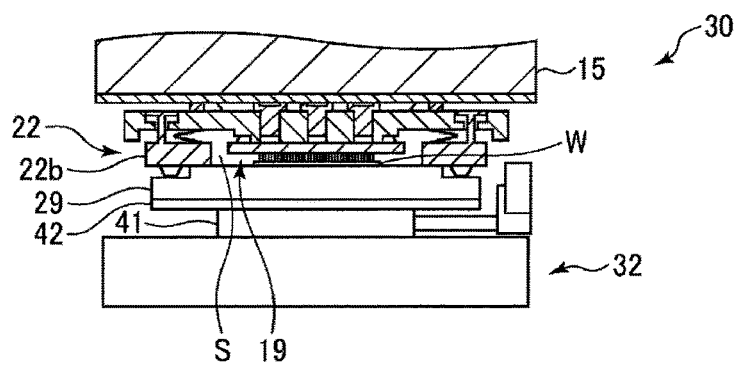
FIG. 11B is a cross-sectional view showing a state in which the chuck top is attracted to the inspection apparatus.

In this state, first, the chuck top 29 is aligned in the horizontal direction by the aligner 32 as shown in FIG. 11A. Then, as shown in FIG. 11B, the chuck base 42 is raised by the Z block 41 of the aligner 32 to bring the wafer W into contact with the contact probes 25 of the probe card 19 and attract the chuck top 29 to the contact portion 22b of the flange 22. At this time, the chuck top 29 is attracted by evacuating the space S surrounded by the chuck top 29, the flange 22, the pogo frame 20, and the probe card 19. Accordingly, the positional relationship between the chuck top 29 and the probe card 19 is maintained, and the wafer W remains in contact with the contact probes 25 of the probe card 19. At this time, a vacuum level is controlled such that a pressing force applied to the wafer W by the chuck top 29 due to the evacuation of the space S becomes greater than a reaction force applied to the chuck top 29 by the contraction of the bellows 23.

Figure 11C:
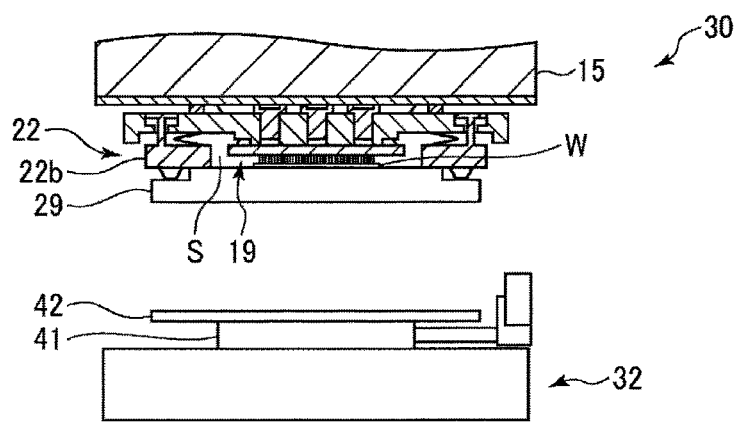
FIG. 11C is a cross-sectional view showing a state in which the aligner is separated after the chuck top is attracted to the inspection apparatus.

Next, as shown in FIG. 11C, in a state where the space S is evacuated, the vacuum attraction between the aligner 32 and the chuck top 29 is released and the aligner 32 is separated from the chuck top 29. In this state, the electrical characteristics of the devices formed on the wafer W are inspected. At this time, a negative pressure caused by the evacuation is not applied to the wafer W due to the presence of the chuck top 29 and, thus, the wafer W is not warped.

The aligner 32 separated from the chuck top 29 is moved to a position below another inspection unit 30 (tester 15) where the inspection of the wafer is completed. Then, the chuck base 42 is raised to connect the aligner 32 to the chuck top 29 attracted and held on the inspection unit 30. Accordingly, the transfer stage 18 is assembled, and the wafer W on the chuck top 29 is transferred to the FOUP of the wafer transfer port 17a. A new wafer W is mounted on the chuck top 29 of the transfer stage 18 and transferred to the same inspection unit 30. Next, the chuck top 29 is raised in the above-described manner to bring the wafer W into contact with the contact probes 25 of the probe card 19. Then, the chuck top 29 is attracted so that the inspection of electrical characteristics can be performed. The above-described operations are repeated for the number of wafers W in the FOUP.

Figure 12A:
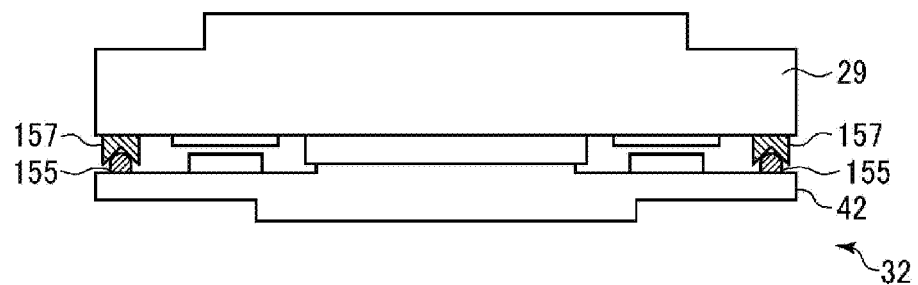
FIG. 12A is a cross-sectional view for explaining a conventional aligning mechanism.

In the case of connecting the chuck top 29 and the aligner 32, it is required to align the chuck top 29 and the aligner 32 with high accuracy. In Patent Document 3, as shown in FIG. 12A, a plurality of positioning pins 155 are disposed on the upper surface of the chuck base 42 of the aligner 32, and a plurality of positioning blocks 157, each having a V-shaped groove, are disposed on the bottom surface of the chuck top 29 to correspond to the positioning pins 155. By engaging the positioning pins 155 with the positioning blocks 157, the alignment in the vertical direction, the horizontal direction, and the rotation direction is simultaneously performed.

Figure 12B:
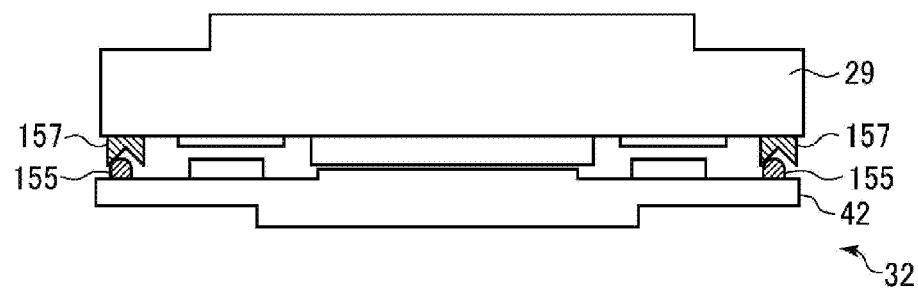
FIG. 12B is a cross-sectional view for explaining drawbacks of the conventional aligning mechanism.

By using the above technique, the alignment may be performed efficiently. However, the above technique is disadvantageous in that the positioning pins 155 are aligned on the inclined surfaces of the V-shaped grooves of the positioning blocks 157, as shown in FIG. 12B, which may result in variation in parallelism between the aligner 32 and the chuck top 29 or the like. Therefore, the chuck base 42 of the aligner 32 may be shaken after the chuck top 29 is mounted on the aligner 32. However, it is still insufficient to avoid such a problem.

Therefore, in the present embodiment, the radially expandable positioning pins 55 are disposed at the peripheral portion of the upper surface of the chuck base 42 in the aligner 32. Further, the pin insertion members 57, each having an insertion hole 57a of which diameter is greater than that of the positioning pin that is not radially expanded, is disposed at the peripheral portion of the bottom surface of the chuck top 29 to correspond to the positioning pins 55. The chuck top 29 and the aligner 32 are aligned by the positioning pins 55 and the pin insertion members 57.

Specifically, first, the aligner 32 is roughly aligned in the horizontal direction based on the coordinates provided by the control unit 70. Then, the chuck base 42 of the aligner 32 is raised, and the positioning pins 55 that are not radially expanded are inserted into the insertion holes 57a of the pin insertion members 57 which have diameters greater than those of the positioning pins 55. In this state, the chuck base 42 is further raised to bring the chuck top attraction surface 52 into contact with the bottom surface of the bottom plate 53 in the chuck top 29 as described with reference to FIG. 5. Accordingly, the chuck top 29 and the aligner 32 are aligned in the vertical direction.

Next, as described with reference to FIGS. 7B and 8, the radially expandable portions 59 project outward from the main bodies 58 of the positioning pins 55 and, thus, the positioning pins 55 are radially expanded. Accordingly, even if the horizontal position of the aligner 32 is displaced, the displacement is corrected by the radial expansion of the positioning pins 55, and the chuck top 29 and the aligner 32 are aligned in the horizontal direction and the rotational direction.

As described above, the chuck top 29 and the aligner 32 are aligned in the vertical direction, and then in the horizontal direction and the rotation direction. Therefore, it is possible to avoid the drawback of the technique disclosed in Patent document 3, such as variation in the parallelism between the aligner 32 and the chuck top 29 which occurs when the alignment in the vertical direction and that in the horizontal direction are performed simultaneously by the positioning pins 155 and the positioning blocks 157. Accordingly, the aligner 32 and the chuck top 29 can be reliably aligned with high accuracy.

Figure 13A:
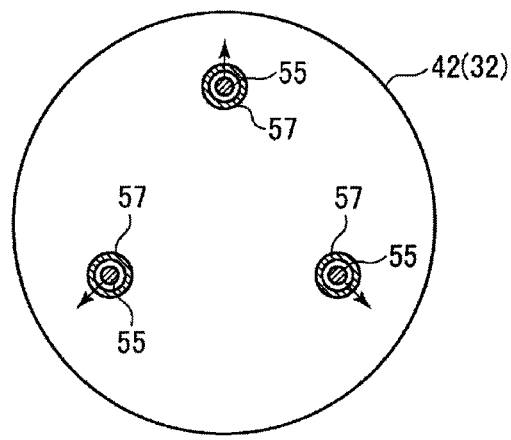
FIG. 13A explains an example of projecting directions of radially expandable portions in the case where three positioning pins and three pin insertion members are provided.
Figure 13B:
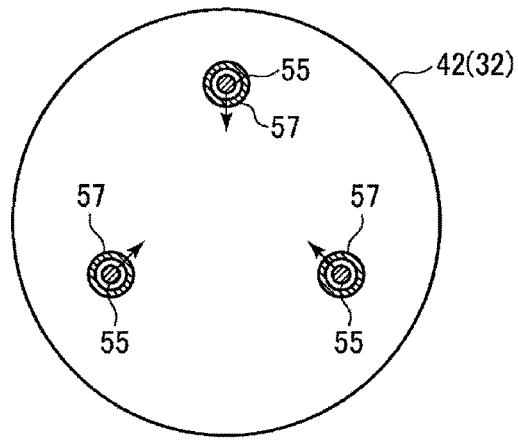
FIG. 13B explains another example of the projecting directions of the radially expandable portions in the case where three positioning pins and three pin insertion members are provided.
Figure 13C:
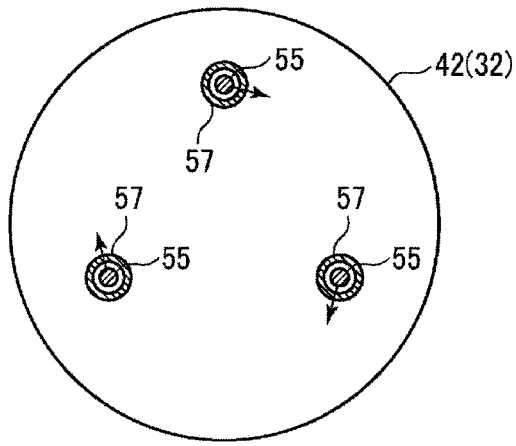
FIG. 13C explains still another example of the projecting directions of the radially expandable portions in the case where three positioning pins and three pin insertion members are provided.

In this case, the projecting direction of the radially expandable portion 59 is important. When three positioning pins 55 and three pin insertion members 57 are arranged at equal intervals on the same circumference, the radially expandable portions 59 project in the directions shown in FIGS. 13A to 13C. In FIG. 13A, the three positioning pins 55 are radially expanded outward. In FIG. 13B, the three positioning pins 545 are radially expanded inward. In FIG. 13C, the three positioning pins 55 are radially expanded in the circumferential direction. Although the alignment can be performed with high accuracy in all examples, the example shown in FIG. 13C is most desirable. In the case of radially expanding the positioning pins 55, even if each of the timing of radial expansion is set to be the same, the timing may be shifted slightly. Even in that case, the alignment can be performed more accurately in the example shown in FIG. 13C. At least one of the projecting directions of the radially expandable portions 59 of the three positioning pins 55 may be different from the others.

Figure 14:
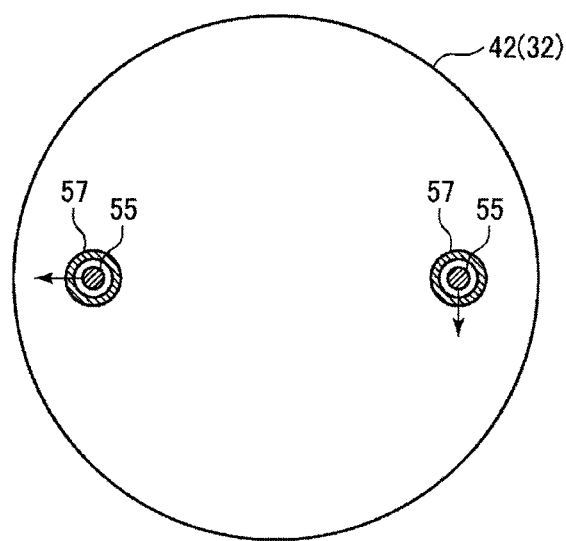
FIG. 14 explains an example of projecting directions of radially expandable portions in the case where two positioning pins and two pin insertion members are provided.

The alignment can also be performed by two positioning pins 55 and two pin insertion members 57. In that case, however, the projecting directions of the radially expandable portions 59 are limited. For example, the positioning cannot be performed when both of the radially expandable portions 59 of the two positioning members 55 project in the radial direction or in the circumferential direction. However, the positioning can be performed when one of the radially expandable portions 59 projects in the radial direction and the other radially expandable portion 59 projects in the circumferential direction, as shown in FIG. 14. The number of the positioning pins 55 and the pin insertion members 57 may be four or more.

The radially expandable portion 59 of the positioning pin 55 may be projected by a mechanical device or an electrical device, other than air. The mechanical device may be a device for holding the radially expandable portion 59 in the main body 58 using a holding device in a state where an elastic body such as a spring or the like is compressed and releasing the holding device so that the radially expandable portion 59 projects outward from the main body 58.

Figure 15:
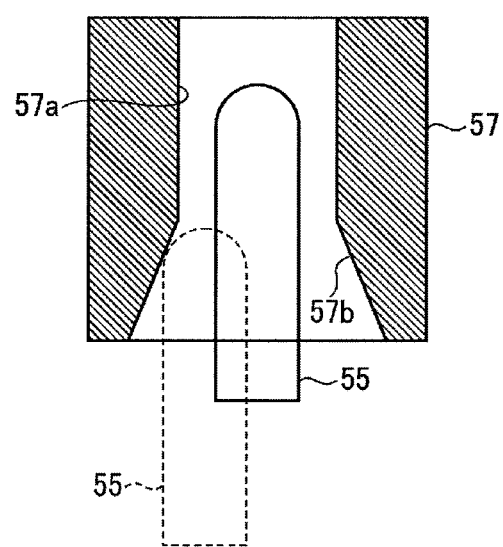
FIG. 15 is a cross-sectional view showing another example of the pin insertion member.

As shown in FIG. 15, the diameter of the lower end portion of the insertion hole 57a of the pin insertion member 57, i.e., the diameter of the positioning pin insertion port, is set to be greater than that of the vertical part so that the inclined portion 57b can be formed at the lower end portion of the pin insertion member 57. Accordingly, even if the positioning pin 55 is displaced considerably, the positioning pin 55 can be lifted along the inclined portion 57b and reliably inserted into the insertion hole 57a.

<Other Applications>

The above-described embodiments are illustrative in all respects and are not restrictive. The above-described embodiments can be embodied in various forms. Further, the above-described embodiments may be omitted, replaced, or changed in various forms without departing from the scope of the appended claims and the gist thereof.

For example, in the above-described embodiments, the radially expandable portions accommodated in the main bodies project outward from the main bodies and, thus, the positioning pins are radially expanded. However, the radial expansion can be performed in a different manner without being limited thereto. For example, the outer surface of the positioning pin may be divided into multiple parts in the vertical direction, and the divided parts may be mechanically moved outward so that the entire pin is radially expanded.

The above-described embodiments have described an example in which the positioning pins are disposed on the upper surface of the aligner (the upper surface of the chuck base) and the pin insertion members are disposed on the bottom surface of the chuck top. However, the pin insertion members may be disposed on the upper surface of the aligner, and the positioning pins may be disposed on the bottom surface of the chuck top.

Further, the above-described embodiments have described the inspection system including multiple inspection apparatuses, each having the probe card and the tester. In this inspection system, while a wafer is being transferred to one inspection apparatus by the transfer stage having the aligner and the chuck top, another wafer can be inspected by another inspection apparatus. However, the present disclosure is not limited thereto, and can be applied to any inspection apparatus including a transfer stage in which a chuck top and an aligner can be brought into contact with each other or separated from each other.

DESCRIPTION OF REFERENCE NUMERALS

10: wafer inspection system
15: tester
16: tester side camera
18: transfer stage
19: probe card
29: chuck top
30: inspection unit
32: aligner
42: chuck base
55: positioning pin
55a: air line (air supply mechanism)
57: pin insertion member
57a: pin insertion hole
58: main body
59: radially expandable portion
S: space
W: wafer

The invention claimed is:

1. An inspection apparatus comprising:
a probe card that has multiple contact probes to be in contact with an inspection target and that is connected to a tester to inspect electrical characteristics of the inspection target; and
a transfer stage configured to transfer the inspection target toward the probe card,
wherein the transfer stage includes:
a chuck top configured to mount thereon the inspection target;
an aligner configured to be brought into contact with the chuck top or separated from the chuck top and configured to move the chuck top; and
an aligning mechanism configured to align the chuck top and the aligner,
wherein the aligning mechanism has radially-expandable positioning pins disposed at a plurality of positions on one between a bottom surface of the chuck top and an upper surface of the aligner, and pin insertion members disposed on the other one between the bottom surface of the chuck top and the upper surface of the aligner which correspond to the positioning pins, each of the pin insertion members having a pin insertion hole of which diameter is greater than a diameter of the positioning pin that is not radially expanded, and
the chuck top and the aligner are aligned with each other by moving the aligner toward the chuck top, inserting the positioning pins into the pin insertion holes, and radially expanding the positioning pins.

2. The inspection apparatus of claim 1, wherein when the positioning pins that are not radially expanded are inserted into the pin insertion holes, vertical alignment is performed by contact between the bottom surface of the chuck top and the upper surface of the aligner, and horizontal alignment is performed by radially expanding the positioning pins.

3. The inspection apparatus of claim 1, wherein each of the positioning pins has a hollow main body, a radially expandable portion accommodated in the main body, and a driving portion that allows the radially expandable portion to be projected outward from the main body and radially expanded.

4. The inspection apparatus of claim 3, wherein the positioning pins include two positioning pins and the pin insertion members include two pin insertion members, and the radially expandable portion of one of the two positioning pins projects in a radial direction and the radially expandable portion of the other of the two positioning pins projects in a circumferential direction.

5. The inspection apparatus of claim 3, wherein the positioning pins and the pin insertion members include three positioning pins and three pin insertion members, respectively, on the same circumference.

6. The inspection apparatus of claim 5, wherein radially expandable portions of the three positioning pins project in the circumferential direction.

7. The inspection apparatus of claim 5, wherein radially expandable portions of the three positioning pins project radially inward.

8. The inspection apparatus of claim 5, wherein radially expandable portions of the three positioning pins project radially outward.

9. The inspection apparatus of claim 1, wherein the pin insertion member is formed in a cylindrical shape and has an inner wall that is a vertical circumferential surface.

10. The inspection apparatus of claim 1, wherein the pin insertion member is formed in a cylindrical shape, and
wherein an inner wall of the pin insertion member has a vertical part that is a vertical circumferential surface, and an inclined surface extending from the vertical part toward a positioning pin insertion port having a diameter greater than a diameter of the vertical part.

11. An inspection system comprising:
a plurality of inspection units, each including a probe card that has multiple contact probes to be in contact with an inspection target and that is connected to a tester to inspect electrical characteristics of the inspection target; and
a transfer stage configured to transfer the inspection target toward the inspection units and bring the inspection target into contact with the contact probes of the probe card,
wherein the transfer stage includes:
a chuck top configured to mount thereon the inspection target;
an aligner configured to be brought into contact with the chuck top or separated from the chuck top and configured to move the chuck top; and
an aligning mechanism configured to align the chuck top and the aligner,
wherein when the inspection target is transferred to the inspection unit, the chuck top and the aligner are connected to each other,
in one of the inspection units, the inspection target on the chuck top is brought into contact with the contact probes of the probe card by the aligner,
the aligner is separated from the chuck top, is connected to a chuck top of another inspection unit, and transfers an inspected target,
the aligning mechanism has radially-expandable positioning pins disposed at a plurality of positions on one between a bottom surface of the chuck top and an upper surface of the aligner, and pin insertion members disposed on the other one between the bottom surface of the chuck top and the upper surface of the aligner which correspond to the positioning pins, each of the pin insertion members having a pin insertion hole of which diameter is greater than a diameter of the positioning pin that is not radially expanded, and
the chuck top and the aligner are aligned with each other by moving the aligner toward the chuck top, inserting the positioning pins into the pin insertion holes, and radially expanding the positioning pins.

12. An aligning method for aligning a chuck top and an aligner in an inspection apparatus including: a probe card that has multiple contact probes to be in contact with an inspection target and that is connected to a tester to inspect electrical characteristics of the inspection target: and a transfer stage configured to transfer the inspection target toward the probe card, wherein the transfer stage includes: a chuck top configured to mount thereon the inspection target: and an aligner configured to be brought into contact with the chuck top or separated from the chuck top and configured to move the chuck top, the inspection method comprising: performing vertical alignment by aligning the bottom surface of the chuck top and the upper surface of the aligner; performing horizontal alignment; wherein in said performing the horizontal alignment, radially expandable positioning pins are disposed at a plurality of positons on one between the bottom surface of the chuck top or the upper surface of the aligner, and pin insertion members are disposed on the other one between the bottom surface of the chuck top and the upper surface of the aligner which correspond to the positioning pins, each of the pin insertion members having a pin insertion hole of which diameter is greater than a diameter of the positioning pin that is not radially expanded, and the alignment is performed by moving the aligner toward the chuck top, inserting the positioning pins through the pin insertion holes, and radially expanding the positioning pins.

* * * * *